United States Patent [19]

Gillig

[11] Patent Number: 4,970,475

[45] Date of Patent: Nov. 13, 1990

[54] LINEARIZED THREE STATE PHASE DETECTOR

[75] Inventor: Steven F. Gillig, Roselle, Ill.

[73] Assignee: Motorola Inc., Schaumburg, Ill.

[21] Appl. No.: 500,626

[22] Filed: Mar. 28, 1990

[51] Int. Cl.⁵ .......................................... H03L 7/089
[52] U.S. Cl. .................................... 331/25; 331/1 A; 307/528; 328/133
[58] Field of Search ................. 331/1 A, 25; 307/527, 307/528; 328/133, 134

[56] References Cited

U.S. PATENT DOCUMENTS

| | | | |
|---|---|---|---|
| 3,958,186 | 5/1976 | Jesse et al. | 331/4 |
| 4,244,043 | 1/1981 | Fujita et al. | 331/25 X |
| 4,378,509 | 3/1983 | Hatchett et al. | 307/528 |
| 4,764,737 | 8/1988 | Kaatz | 331/1 A |

*Primary Examiner*—David Mis
*Attorney, Agent, or Firm*—Kenneth W. Bolvin

[57] ABSTRACT

A linearized three state phase detector (300) that exhibits a linear transfer function of phase to current or charge at and around the zero phase error region. The inputs to the D flip-flops (301 and 302) are tied to a logic high. the first flip-flop (301) is clocked with reference signal $F_r$ while the other flip-flop (302) is clocked with a variable frequency feedback signal $F_v$. $F_v$ is typically from a voltage controlled oscillator in a phase locked loop. The outputs of the flip-flops are ANDed together with the result of this operation going through a delay element (304) before resetting one of the flip-flops (301). The other flip-flop (302) is reset by the output of the AND gate (304) without the delay element (304). Each flip-flop output enables a charge pump—one negative polarity (306) and one positive polarity (305). The present invention will maintain a lock condition in a phase locked loop by extending the DOWN pulse enabling the negative polarity charge pump (306) to the same width as the UP pulse that enables the positive pump (305). This will create a net zero charge from the present invention.

20 Claims, 3 Drawing Sheets

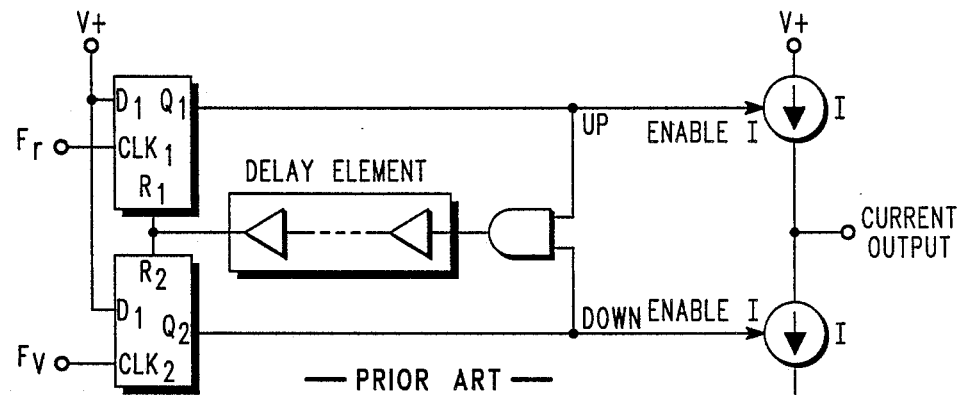
FIG.1 — PRIOR ART —
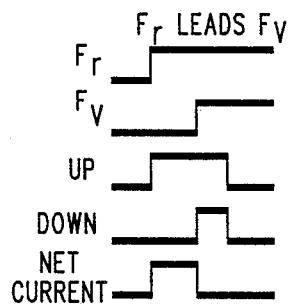
FIG.2A
— PRIOR ART —
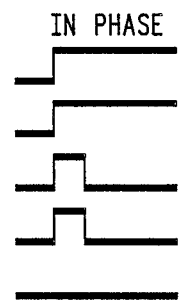
FIG.2B
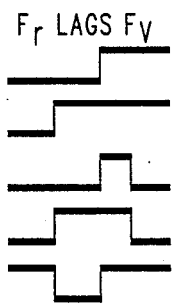
FIG.2C
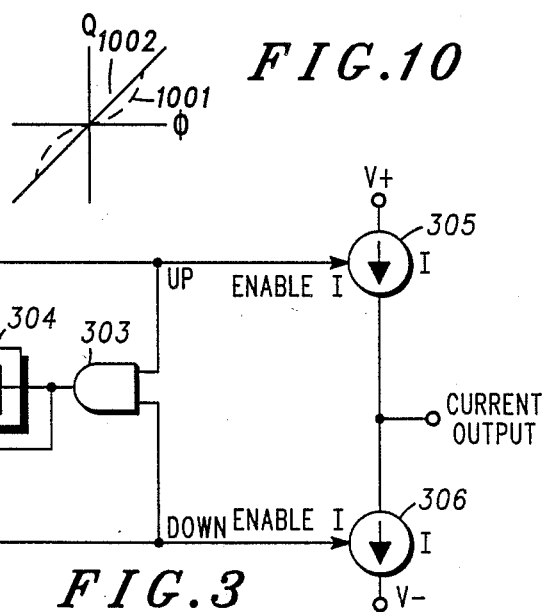
FIG.10
FIG.3

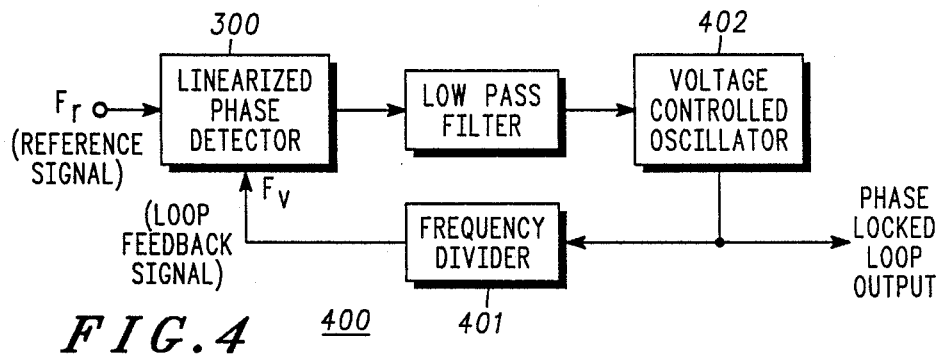
FIG.4
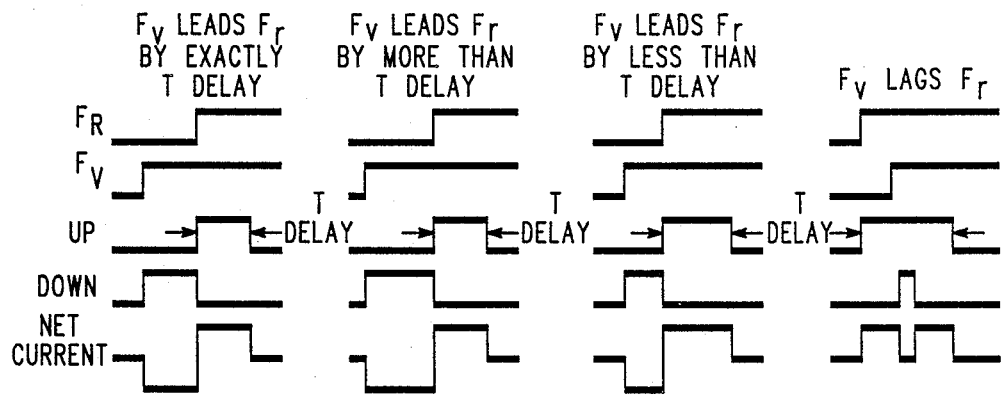
FIG.5A  FIG.5B  FIG.5C  FIG.5D
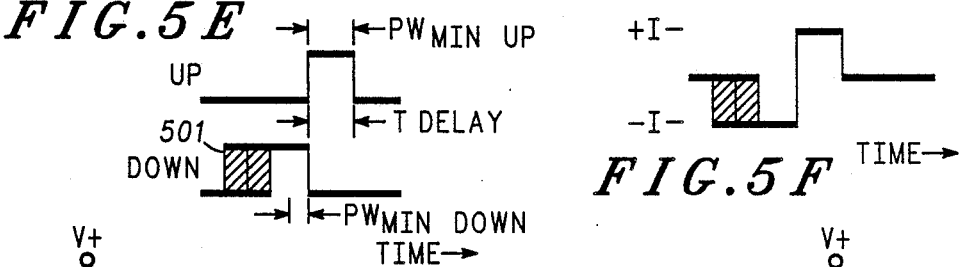
FIG.5E
FIG.5F
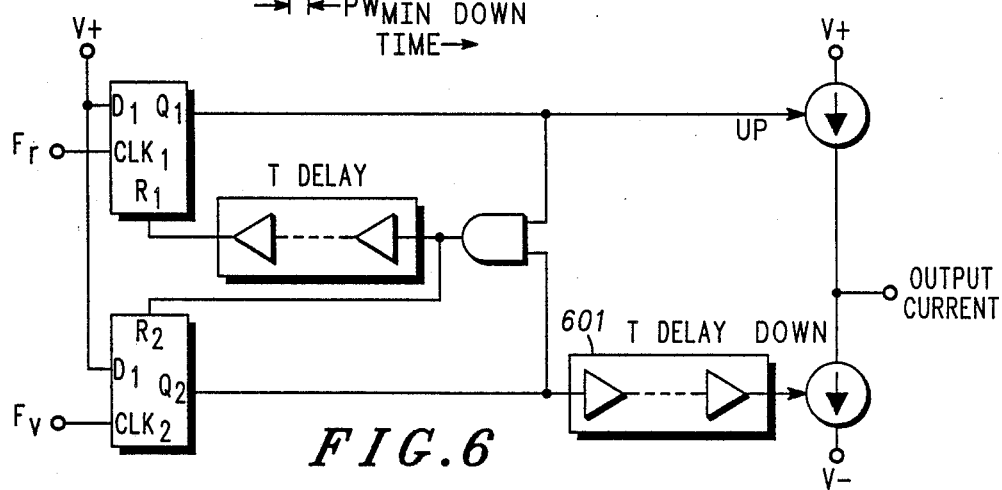
FIG.6

LINEARIZED THREE STATE PHASE DETECTOR

Field of the Invention

The present invention relates to phase detection circuits as may be used in phase locked loops.

Background of the Invention

Phase detection circuits are typically used to detect a phase difference between two signals. These circuits can be used in phase locked loops (PLL) to detect a difference between a reference signal generated by a reference oscillator and a loop feedback signal. The output of the phase detection circuit is then used to produce a fixed phase relationship between the PLL output signal and the input reference signal. PLLs are discussed in H. Krauss, C. Bostian, and F. Raab, *Solid State Radio Engineering* at Chapter 6 (1980).

A typical three state phase detector circuit is illustrated in FIG. 1. The D inputs to both flip-flops is tied to a logic high. The reference signal of reference frequency $F_r$ clocks one flip-flop and the loop feedback signal of variable frequency $F_v$ clocks the other flip-flop. The outputs of the flip-flops are input to an AND gate. The output of the AND gate is input to a delay element the output of which is connected to the reset inputs of the flip-flops. The delay element causes the outputs of the flip-flops to have a minimum pulse width, even during a zero phase error condition. The outputs of the flip-flops also each enable a charge pump. The charge pumps are connected at a common node that is the output of the circuit.

Assuming both flip-flops start in the zero state, the circuit operates by the $F_r$ and $F_v$ signals clocking in the logic high from the flip-flop inputs. If $F_r$ leads $F_v$, as illustrated in FIG. 2A, the positive polarity charge pump is turned on by the output from that D flip-flop causing a positive pulse to be output from the circuit. The width of the net output pulse is the difference between the time the $F_r$ flip-flop is clocked to the time the $F_v$ flip-flop is clocked. Once the $F_v$ flip-flop is clocked, the inputs to the AND gate will both be a logic one causing the output of the AND gate to be a logic one, thereby resetting the flip-flops after a delay, turning off the charge pumps and ending the output pulses from the flip-flops.

If $F_r$ lags $F_v$, as illustrated in FIG. 2B, the negative polarity charge pump is turned on by the output of the $F_v$ flip-flop, causing a negative pulse to be output from the circuit. The width of the net output pulse is the time between the $F_v$ flip-flop being clocked and the $F_r$ flip-flop being clocked. Once the $F_r$ flip-flop is clocked, both inputs to the AND gate will be a logic one causing the output of the AND gate to be a logic one and turning off the charge pumps. The logic one output from the AND gate will reset the flip-flops after a delay, thereby turning off the charge pumps and ending the output pulses from the flip-flops.

If $F_r$ and $F_v$ are in phase, as illustrated in FIG. 2C, both charge pumps will be turned on at the same time, producing a net output current of zero. Ideal charge pumps used in an ideal phase detector will produce no net charge in this state because both currents would be exactly balanced in phase and amplitude and have infinitely fast rise and fall times.

The output of this circuit is low pass filtered before driving a voltage controlled oscillator, the frequency divided output of which is the loop feedback signal. The positive or negative pulse from the phase detection circuit will cause the VCO to change frequency and phase until $F_v = F_r$ both in frequency and phase. At this point, the output from the phase detection circuit will be a zero value and the VCO will be locked on that particular frequency.

Present phase detection circuits used in PLLs typically have a linear transfer function. Around the zero phase error region, however, there can exist a non-linear transfer function of phase to current or charge. This non-linearity degrades the spectral purity of the PLLs signal, especially when used with fractional division, by increasing the amplitude of the sidebands at subharmonics and harmonics of the output frequency resolution. See Martin, U.S. Pat. No. 4,816,774 assigned to Motorola, for a discussion on output frequency resolution. There is a resulting need for a phase detection circuit that has a more linear transfer function of phase to current or charge for small phase differences, thereby attenuating these sidebands.

SUMMARY OF THE INVENTION

It is an object of the present invention to provide linear phase detection for small phase differences.

The present invention is comprised of two D type flip-flops, an AND gate, and a delay element. The inputs to the D flip-flops are tied to a logic high. The first flip-flop is clocked with a reference signal while the other flip-flop is clocked with a feedback signal, typically from a voltage controlled oscillator in a phase locked loop. The outputs of the flip-flops are ANDed together with the result of this operation going through a delay element before resetting one of the flip-flops. The other flip-flop is reset by the output of the AND gate without the delay element. Each flip-flop output enables a charge pump—one negative polarity and one positive polarity.

The present invention will maintain a lock condition in a phase locked loop by extending the DOWN pulse enabling the negative polarity charge pump to the same width as the UP pulse that enables the positive pump. This will create a net zero charge from the present invention.

BRIEF DESCRIPTION OF THE DRAWINGS

FIG. 1 shows a prior art phase detection circuit.

FIGS. 2A, 2B, 2C show timing diagrams generated by the prior art phase detection circuit shown in FIG. 1.

FIG. 3 shows a block diagram of the present invention.

FIG. 4 shows a block diagram of the present invention as used in a phase locked loop.

FIGS. 5A, 5B, 5C, 5D, 5E, and 5F show timing diagrams generated by the present invention.

FIG. 6 shows an alternate embodiment of the present invention.

FIG. 10 shows a plot of the transfer function for the prior art and the present invention.

DETAILED DESCRIPTION OF THE PREFERRED EMBODIMENT

Figure 7:
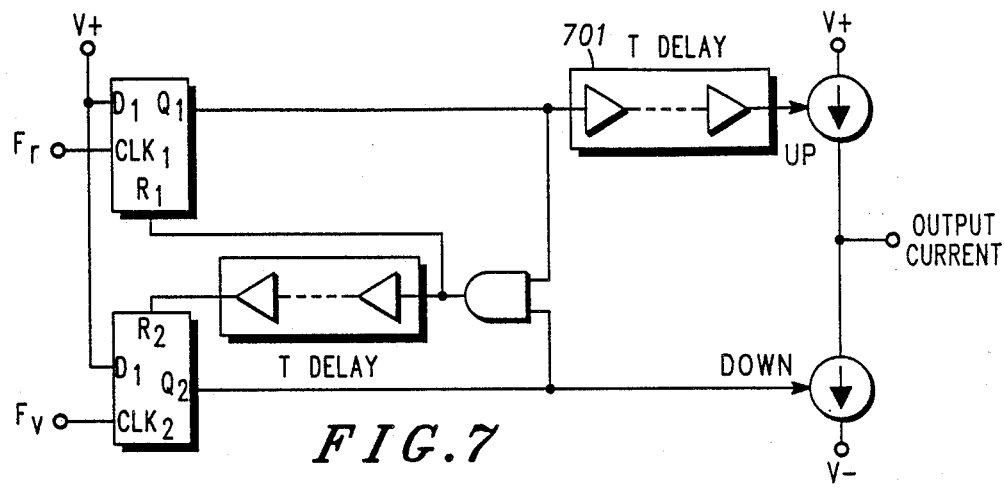
FIG. 7 shows another alternate embodiment of the present invention.

The present invention detects phase differences between two signals, and is particularly useful in detecting small phase differences while maintaining a substantially linear transfer function of phase to current or charge. The present invention is used for phase detection in phase locked loops (PLL).

As illustrated in FIG. 3, the present invention is comprised of two D type flip-flops (301 and 302), an AND gate (303), and a delay element (304). The flip-flops (301 and 302), with their D inputs tied to a logic high, are clocked by two separate signals. One is clocked by a reference signal having a frequency $F_r$ and the other is clocked by a variable frequency signal $F_v$. If the present invention is used in a PLL (400), as illustrated in FIG. 4, $F_r$ is generated by a reference oscillator and $F_v$ is the loop feedback output of the frequency divider (401). The outputs of the flip-flops (301 and 302) are ANDed and the resulting AND gate (303) output delayed by the delay element (304). The output of the delay element (304) is used to reset one of the flip-flops (301) while the output from the AND gate (303) prior to the delay element (304) resets the other flip-flop (302); it is irrelevant which flip-flop (301 or 302) gets reset by the delayed AND gate (303) output. Each of the flip-flop outputs is used to enable a charge pump—a negative polarity source (306) and a positive polarity source (305). The output of the present invention is the common node between the two charge pumps (305 and 306).

Assuming both flip-flops (301 and 302) start in the zero state, the present invention operates by the $F_r$ and $F_v$ signals clocking in the logic high from the flip-flop inputs. The $F_v$ signal clocks the $F_v$ flip-flop (302) to a high state causing a high pulse on the DOWN line. Similarly, the $F_r$ signal clocks the $F_r$ flip-flop (301) to a high state causing a high pulse on the UP line. These pulses enable the negative and positive polarity charge pumps (305 and 306) respectively. The width of any negative pulse will be the difference between the time the $F_v$ flip-flop (302) is clocked to the time the $F_r$ flip-flop (301) is clocked by the rising edge of $F_r$. Once the $F_r$ flip-flop (301) is clocked, the inputs to the AND gate (303) will both be a logic one, thereby resetting the $F_v$ flip-flop (302) immediately and resetting the $F_r$ flip-flop (301) after a delay of $T_{delay}$. A positive output current pulse is thus produced that will always be $T_{delay}$ wide due to the $T_{delay}$ before the Fr flip-flop (301) is reset.

When $F_v$ leads $F_r$ by exactly $T_{delay}$, as illustrated in FIG. 5A, the width of the positive and negative current pulses are both equal to $T_{delay}$ so that the net current at the output, integrated over both pulses, is zero. This condition occurs when the PLL is in phase lock.

When $F_v$ leads $F_r$ by more than $T_{delay}$, as illustrated in FIG. 5B, the negative output pulse is wider than the positive output pulse; the positive output pulse having a width of $T_{delay}$. In this case, the net current produced by the present invention, integrated over both pulses, is negative.

When $F_v$ leads $F_r$ by less than $T_{delay}$, as illustrated in FIG. 5C, the negative output pulse is narrower than the positive output pulse; the positive output pulse having a width of $T_{delay}$. The net current produced by the present invention in this case, integrated over both pulses, is positive.

It is also possible for $F_v$ to lag $F_r$, as illustrated in FIG. 5D. In this case, the PLL is greatly out of lock. The UP pulse produced is wider than $T_{delay}$ by the amount of time that $F_r$ leads $F_v$, while the DOWN pulse is only as wide as the sum of the inherent delays of the circuit elements.

In an actual circuit, the inherent delay of the flip-flops (301 and 302) and AND gate (303) will make the width of the positive pulse slightly more than $T_{delay}$ and the negative pulse will be active slightly beyond when $F_r$ goes high. This does not result in behavior any different from the idealized case previously described except that the positive and negative pulses overlap for a time equal to the inherent delay of the flip-flops (301 and 302) and AND gate (303).

When the present invention is used in a PLL (400) to maintain a lock condition, the DOWN pulse extends to the same width as the UP pulse, creating a net zero charge from the pump. The DOWN pulse, however, will always lead the UP pulse in phase by $T_{delay}$. Any phase modulation in the PLL is done by the leading edge (501) of the DOWN pulse, as seen by the moving leading edge (501), as long as the DOWN pulse width is maintained greater than $PW_{minDOWN}$ as shown in FIG. 5E. This, in effect, produces a fixed phase error between $F_r$ and $F_v$. The remaining non-linearity in the present invention will be due to the DOWN path alone and will be small if the modulation is small compared to $PW_{minUP}$.

Figure 8:
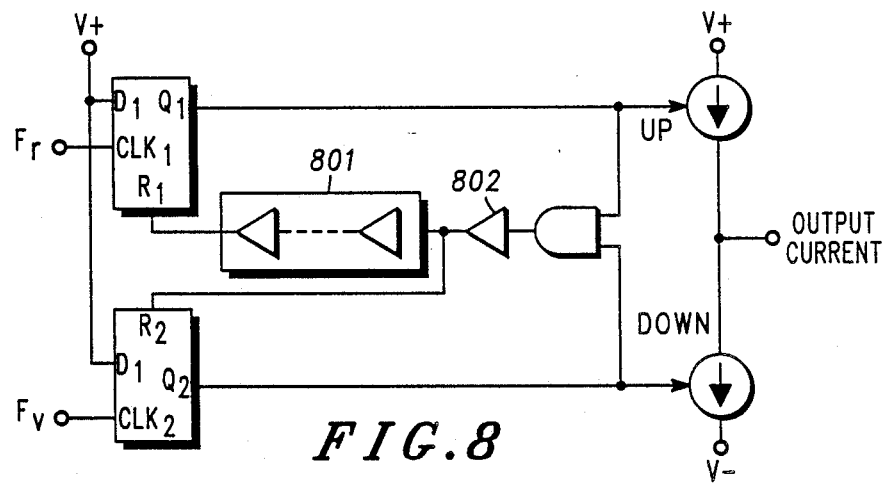
FIG. 8 shows yet another alternate embodiment of the present invention.
Figure 9:
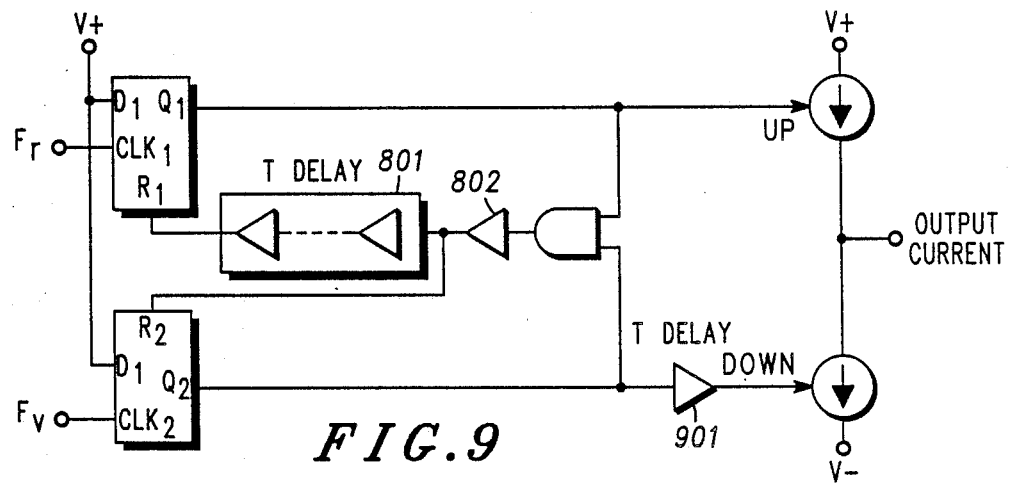
FIG. 9 shows yet another alternate embodiment of the present invention.

The composite current output of the present invention (300) produced by summing the UP/DOWN pulses in opposite phase, as illustrated in FIG. 5F, will produce reference spurs that will modulate the VCO (402) in the PLL (400). While this will be acceptable in many applications, some applications will not accept this. This can be remedied by the alternate embodiments illustrated in FIGS. 6 and 7. A delay element (601 and 701) of delay $T_{delay}$ can be inserted in the path of the flip-flop that is being reset with the AND gate output that is not delayed. This delay will bring the two pulses from the flip-flops back into phase, thereby eliminating any induced VCO modulation caused by non-overlapping pulses. An alternate embodiment can also have a delay (801 and 802) in both reset signals, as illustrated in FIG. 8. Yet another alternate embodiment, illustrated in FIG. 9, utilizes a delay (901) of $T_{delay}$ in the DOWN path to bring the two pulses from the flip-flops into phase.

FIG. 10 illustrates both the prior art phase to charge transfer function (1001) and the present invention's phase to charge transfer function (1002). The prior art transfer function (1001) is non-linear at the zero phase error region while the present invention transfer function (1002) is linear in this region.

In summary, the present invention has been shown to detect small phase differences between two signals. The present invention, when used in a PLL having fractional division, will maintain a linear transfer function of phase to current or charge at and around the zero phase error region.

I claim:

1. A phase detection apparatus for generating a phase difference signal for use in a phase locked loop, the phase detection apparatus having an input for a loop feedback signal, an input for a reference signal, and an output for the phase difference signal, comprising:
   (a) first storage means comprising a reset input, a first clock input, and an output;
   (b) second storage means comprising a reset input, a second clock input, and an output;

(c) means for logically combining having a first input coupled to the output of the first storage means and a second input coupled to the output of the second storage means and an output coupled to the reset input of the second storage means; and (d) delaying means having an input coupled to the output of the means for logically combining and an output coupled to the reset input of the first storage means;

wherein the reference signal is coupled to the first clock input, the loop feedback signal is coupled to the second clock input, and the output of the first storage means and the output of the second storage means are coupled to form the output for the phase difference signal.

2. The apparatus of claim 1 wherein the first and the second storage means are D type flip-flops that further comprise data inputs coupled to a logic high.

3. The apparatus of claim 1 wherein the means for logically combining is a logical AND gate.

4. The apparatus of claim 1 wherein the output of the first storage means and the output of the second storage means are coupled by a first current source having an enable input coupled to the output of the first storage means and a second current source having an enable input coupled to the output of the second storage means, the first and second current sources coupled to form the output for the phase difference signal.

5. A phase detection apparatus for generating a phase difference signal for use in a phase locked loop, the phase detection apparatus having an input for a loop feedback signal, an input for a reference signal, and an output for the phase difference signal, comprising:

(a) first storage means having a reset input, a first clock input, and an output;

(b) first current sourcing means having an enable input coupled to the output of the first storage means;

(c) second storage means having a reset input, a second clock input, and an output;

(d) second current sourcing means having an enable input coupled to the output of the second storage means;

(e) means for logically combining having a first input coupled to the output of the first storage means and a second input coupled to the output of the second storage means and an output coupled to the reset input of the second storage means; and (f) delaying means having an input coupled to the output of the means for logically combining and an output coupled to the reset input of the first storage means;

wherein the reference signal is coupled to the first clock input, the loop feedback signal is coupled to the second clock input, and the first current sourcing means and the second current sourcing means are coupled to form the output for the phase difference signal.

6. The apparatus of claim 5 wherein the first and the second storage means are D type flip-flops that further comprise data inputs coupled to a logic high.

7. The apparatus of claim 5 wherein the means for logically combining is a logical AND gate.

8. A phase locked loop apparatus having a reference signal input and an oscillator output, comprising:

(a) filter means having an input and an output;

(b) controllable oscillator means having an input and output for producing the oscillator output, the input coupled to the output of the filter means;

(c) frequency dividing means having an input coupled to the oscillator output, and an output for producing a loop feedback signal; and (d) a phase detection apparatus, comprising:

first storage means comprising a reset input, a first clock input, and an output;

second storage means comprising a reset input, a second clock input, and an output;

means for logically combining having a first input coupled to the output of the first storage means and a second input coupled to the output of the second storage means and an output coupled to the reset input of the second storage means; and delaying means having an input coupled to the output of the means for logically combining and an output coupled to the reset input of the first storage means;

wherein the reference signal is coupled to the first clock input, the loop feedback signal of the frequency dividing means is coupled to the second clock input, and the output of the first storage means and the output of the second storage means are coupled to the input of the filter means.

9. The apparatus of claim 8 wherein the first and the second storage means are D type flip-flops that further comprise data inputs coupled to a logic high.

10. The apparatus of claim 8 wherein the means for logically combining is a logical AND gate.

11. The apparatus of claim 8 wherein the controllable oscillator means is a voltage controlled oscillator.

12. The apparatus of claim 8 wherein the output of the first storage means and the output of the second storage means are coupled by a first current source having an enable input coupled to the output of the first storage means and a second current source having an enable input coupled to the output of the second storage means, the first and second current sources coupled to the input of the filter means.

13. A phase detection apparatus for generating a phase difference signal for use in a phase locked loop, the phase detection apparatus having an input for a loop feedback signal, an input for a reference signal, and an output for the phase difference signal, comprising:

(a) first storage means having a reset input, a first clock input, and an output;

(b) first current sourcing means having an enable input coupled to the output of the first storage means;

(c) second storage means having a reset input, a second clock input, and an output;

(d) first delaying means having an input and an output, the input coupled to the output of the second storage means;

(e) second current sourcing means having an enable input coupled to the output of the first delay means;

(f) means for logically combining having a first input coupled to the output of the first storage means and a second input coupled to the output of the second storage means and an output coupled to the reset input of the second storage means; and (g) second delaying means having an input coupled to the output of the means for logically combining and an output coupled to the reset input of the first storage means;

wherein the reference signal is coupled to the first clock input, the loop feedback signal is coupled to the second clock input and, the first current sourcing means and the second current sourcing means are coupled to form the output for the phase difference signal.

14. The apparatus of claim 13 wherein the first and the second storage means are D type flip-flops that further comprise data inputs coupled to a logic high.

15. The apparatus of claim 13 wherein the means for logically combining is a logical AND gate.

16. The apparatus of claim 13 wherein the second delaying means is coupled to the means for logically combining by a third delaying means.

17. A phase detection apparatus for generating a phase difference signal for use in a phase locked loop, the phase detection apparatus having an input for a loop feedback signal, an input for a reference signal, and an output for the phase difference signal, comprising:
(a) first storage means comprising a reset input, a first clock input, and an output;
(b) second storage means comprising a reset input, a second clock input, and an output;
(c) means for logically combining having a first input, a second input, and an output, the first input coupled to the output of the first storage means and the second input coupled to the output of the second storage means;
(d) first delaying means having an input and an output, the input coupled to the output of the means for logically combining and the output coupled to the reset input of the first storage means; and
(e) second delaying means having an input and an output, the input coupled to the output of the means for logically combining and an output coupled to the reset input of the second storage means;
wherein the reference signal is coupled to the first clock input, the loop feedback signal is coupled to the second clock input, and the output of the first storage means and the output of the second storage means are coupled to form the output for the phase difference signal.

18. The apparatus of claim 17 wherein the first and the second storage means are D type flip-flops that further comprise data inputs coupled to a logic high.

19. The apparatus of claim 17 wherein the means for logically combining is a logical AND gate.

20. The apparatus of claim 17 wherein the first delaying means has a delay that is larger than a delay of the second delaying means.

* * * * *